US012615803B2

(12) United States Patent
Sharma et al.

(10) Patent No.: US 12,615,803 B2
(45) Date of Patent: Apr. 28, 2026

(54) TRANSISTOR WITH A PRIMARY GATE WRAPPING A FLOATING SECONDARY GATE

(71) Applicant: GlobalFoundries U.S. Inc., Malta, NY (US)

(72) Inventors: Santosh Sharma, Austin, TX (US); Shesh Mani Pandey, Saratoga Springs, NY (US); Rajendran Krishnasamy, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 582 days.

(21) Appl. No.: 18/152,710

(22) Filed: Jan. 10, 2023

(65) Prior Publication Data

US 2024/0234533 A1     Jul. 11, 2024

(51) Int. Cl.
| | |
|---|---|
| *H10D 30/67* | (2025.01) |
| *H10D 30/01* | (2025.01) |
| *H10D 30/47* | (2025.01) |
| *H10D 62/85* | (2025.01) |
| *H10D 64/01* | (2025.01) |
| *H10D 64/64* | (2025.01) |

(52) U.S. Cl.
CPC ......... *H10D 30/675* (2025.01); *H10D 30/015* (2025.01); *H10D 30/475* (2025.01); *H10D 30/6738* (2025.01); *H10D 62/85* (2025.01); *H10D 64/01* (2025.01); *H10D 64/64* (2025.01)

(58) Field of Classification Search
CPC .............. H10D 64/511; H10D 64/512; H10D 30/47–478; H10D 62/021; H10D 62/8503
See application file for complete search history.

(56) References Cited

U.S. PATENT DOCUMENTS 8,338,860 B2     12/2012   Bhalla et al.
9,553,183 B2 *   1/2017    Curatola .............. H10D 30/015
(Continued)

OTHER PUBLICATIONS

Ma et al., "Kilovolt Tri-Gate GaN Junction HEMTs with High Thermal Stability," The 33rd International Symposium on Power Semiconductor Devices and ICs (ISPSD), May 30-Jun. 3, 2021, Nagoya Full Virtual Conference, pp. 139-142.
(Continued)

*Primary Examiner* — Syed I Gheyas
(74) *Attorney, Agent, or Firm* — Francois Pagette; Hoffman Warnick LLC

(57) ABSTRACT

Disclosed is a structure including a substrate and a transistor on the substrate. The transistor includes a barrier layer above the substrate and a multi-gate structure on the barrier layer. The multi-gate structure includes a primary gate and a secondary gate. The secondary gate has opposing sidewalls, opposing end walls and a top surface. The primary gate includes essentially vertically-oriented first portions on the barrier layer positioned laterally adjacent to opposing sidewalls, respectively, of the secondary gate. Optionally, the primary gate also includes an essentially horizontally-oriented second portion on the top surface of the secondary gate and/or essentially vertically-oriented third portions on the opposing end walls, respectively. The secondary gate can be a floating gate. Also disclosed is a method of forming the structure.

20 Claims, 13 Drawing Sheets

(56)                    References Cited

U.S. PATENT DOCUMENTS

| | | | |
|---|---|---|---|
| 2005/0189559 A1* | 9/2005 | Saito | H10D 30/4755 |
| | | | 257/E29.252 |
| 2014/0203288 A1 | 7/2014 | Hsiung | |
| 2022/0157979 A1* | 5/2022 | Yang | H10D 62/824 |
| 2024/0014307 A1* | 1/2024 | Chen | H10D 30/475 |

OTHER PUBLICATIONS

Wang et al., "A novel enhancemode AlGaN/GaN HEMT with split floating gates," Department of Electrical and Electronic Engineering, Southern University of Science and Technology, Shenzhen Key Laborary of the Third Generation Semiconductor, Shenzhen China 518055, published IEEE 2016, downloaded Nov. 11, 2022, 4 pages.
European Search Report for corresponding EP Application No. 23203730.9-1211 dated Apr. 17, 2024, 9 pages.

\* cited by examiner

| 103 |
|---|
| 102 |
| 101 |

FIG. 2

| 130 |
|---|
| 103 |
| 102 |
| 101 |

FIG. 3

TRANSISTOR WITH A PRIMARY GATE WRAPPING A FLOATING SECONDARY GATE

GOVERNMENT LICENSE RIGHTS

This invention was made with government support under contract number HQ0727790700 and awarded by the United States Defense Microelectronics Activity (DMEA). The government has certain rights in the invention.

BACKGROUND

The present disclosure relates to transistors, and, more particularly, to embodiments of a semiconductor structure including a transistor and to embodiments of a method of forming the structure.

Factors considered in modern integrated circuit (IC) design include, but are not limited to, performance improvement, size scaling, and power consumption. Oftentimes, however, there is a tradeoff between these factors. For example, with device size scaling, transistors, such as high electron mobility transistors (HEMTs), can suffer from performance degradation.

SUMMARY

Disclosed herein are embodiments of a structure. The structure can include a substrate and a transistor on the substrate. The transistor can include a barrier layer. The transistor can further include both a primary gate and a secondary gate. The secondary gate can be on the barrier layer and can have opposing sidewalls. The primary gate can have first portions, which are on the barrier layer and positioned laterally adjacent to the opposing sidewalls, respectively.

In some of the disclosed embodiments, the structure can include a substrate and a transistor on the substrate. The transistor can include a barrier layer. The transistor can also include a primary gate and a secondary gate. The secondary gate can be on the barrier layer. It can have opposing sidewalls, opposing end walls and a top surface. Additionally, the secondary gate can include a P-type III-V semiconductor layer and can be floating. The primary gate can include a gate dielectric layer, which is immediately adjacent to the barrier layer and which extends over and is immediately adjacent to the opposing sidewalls, the opposing end walls, and the top surface of the secondary gate, and a gate conductor layer, which is on the gate dielectric layer. The primary gate can have: first portions, which are on the barrier layer and positioned laterally adjacent to the opposing sidewalls, respectively, of the secondary gate; a second portion, which is on the top surface of the secondary gate; and third portions, which are on the barrier layer and positioned laterally adjacent to the opposing end walls, respectively, of the secondary gate.

Also disclosed herein are method embodiments for forming a semiconductor structure. The method embodiments can include providing a substrate and forming a transistor on the substrate. forming the transistor can include forming a secondary gate on a barrier layer and forming a primary gate adjacent to the secondary gate. Specifically, the primary gate can be formed so as to at least have first portions on the barrier layer and positioned laterally adjacent to the opposing sidewalls, respectively, of the secondary gate.

BRIEF DESCRIPTION OF THE DRAWINGS

The present disclosure will be better understood from the following detailed description with reference to the drawings, which are not necessarily drawn to scale and in which:

FIG. 2 is a cross-section diagram illustrating a partially completed semiconductor structure formed according to the disclosed methods;

FIG. 3 is a cross-section diagram illustrating a partially completed semiconductor structure formed according to the disclosed methods;

DETAILED DESCRIPTION

As mentioned above, HEMTs, including d-mode and e-mode HEMTs, have emerged as a leading technology for RF and mmWave wireless applications. Those skilled in the art will recognize that conventional HEMTs are d-mode devices. A d-mode HEMT refers to a HEMT that is normally in an ON-state (i.e., conductive) and only switches to an OFF-state (i.e., becomes non-conductive) when a voltage is applied to the gate of the HEMT. This normally ON-state is due to a zero-bias two-dimensional electron gas (2DEG) below the gate and, particularly, between the barrier and channel layers of the HEMT. Pinch-off refers to the point at which application of a gate voltage (Vg) to the gate of the d-mode HEMT stops charge carrier flow and thereby stops current flow through the channel layer between source/drain terminals. An e-mode HEMT refers to HEMT that is normally in an OFF-state (i.e., non-conductive) and only switches to an ON-state (i.e., becomes conductive) when a voltage is applied to the gate. The gate of a d-mode HEMT can be modified to form an e-mode HEMT. One technique for modifying is to insert a P-type III-V semiconductor layer (e.g., a magnesium (Mg)-doped gallium nitride (GaN) layer or some other suitable P-type III-V semiconductor layer) into the gate (e.g., above the barrier layer and below any gate metal) in order to suppress the zero-bias 2DEG. Unfortunately, with device size scaling HEMT devices can suffer from performance degradation. For example, with a reduction in gate pitch, d-mode HEMTs can suffer from pinch-off control issues and, thus, increased gate leakage.

In view of the foregoing, disclosed herein are embodiments of a semiconductor structure including a d-mode HEMT configured for improved pinch-off control. Specifically, the d-mode HEMT can include a channel layer and a barrier layer on the channel layer. The d-mode HEMT can further include source and drain terminals that extend through the barrier layer toward or to the channel layer and a multi-gate structure on the barrier layer positioned laterally between the source and drain terminals. The multi-gate structure can include a primary gate and, particularly, a d-mode gate that wraps over a secondary gate and, particularly, an e-mode gate. The secondary gate can include a P-type III-V semiconductor layer and be left floating. The primary gate can include essentially vertically-oriented portions on the barrier layer positioned laterally adjacent to opposing sidewalls, respectively, of the secondary gate and an essentially horizontally-oriented portion on the top surface of the secondary gate. Optionally, the primary gate can also include additional essentially vertically-oriented portions positioned laterally adjacent to opposing end walls of the secondary gate. In either case, with this wrap-around multi-gate configuration, better pinch-off control is possible. Also disclosed herein are method embodiments for forming the disclosed semiconductor structures.

Figure 1A:
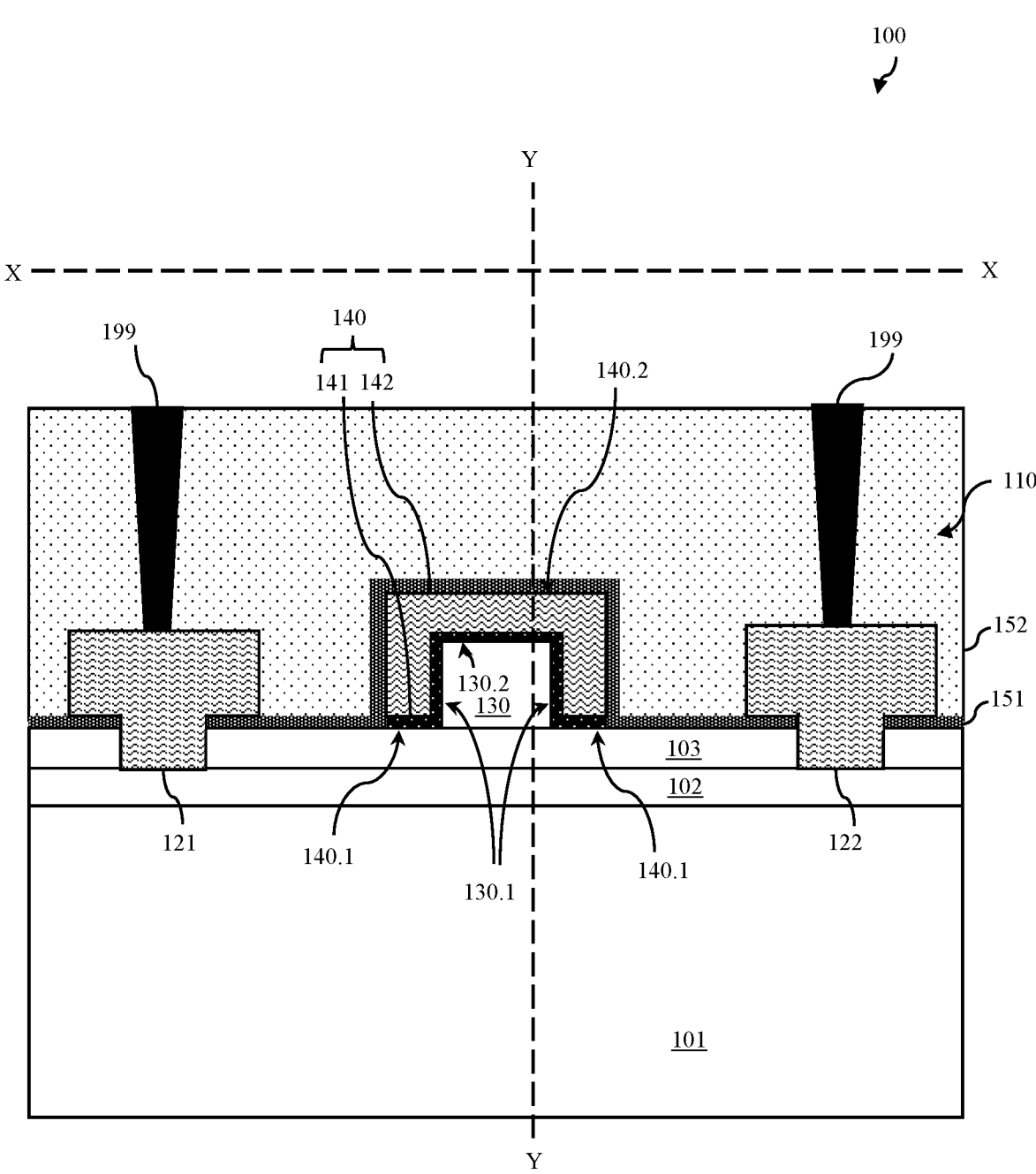
FIG. 1A is a cross-section diagram illustrating a disclosed semiconductor structure with a d-mode HEMT having a multi-gate structure and FIGS. 1B and 1C are different cross-section diagrams illustrating alternative configurations for the multi-gate structure.
Figure 1B:
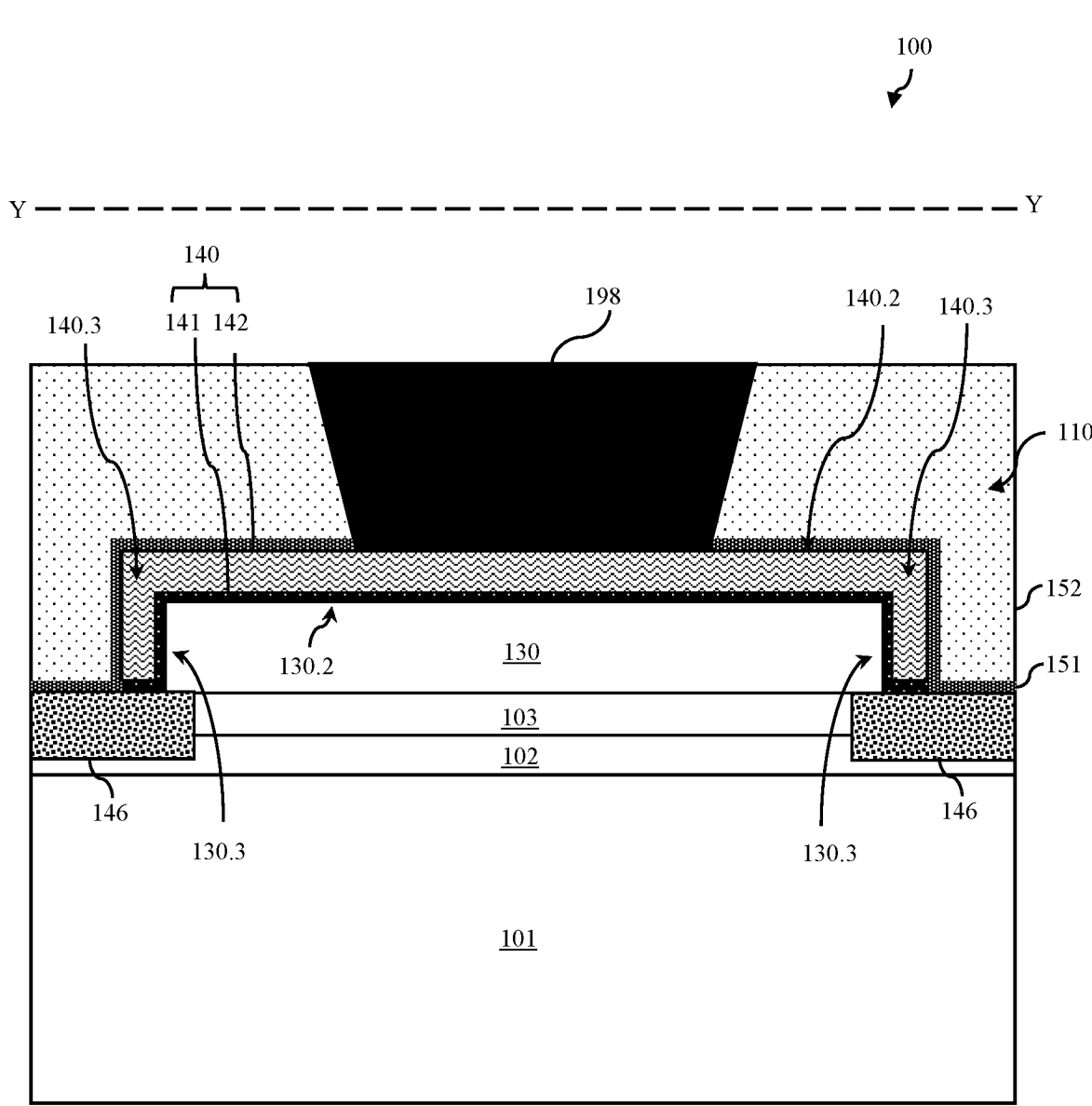
Figure 1C:
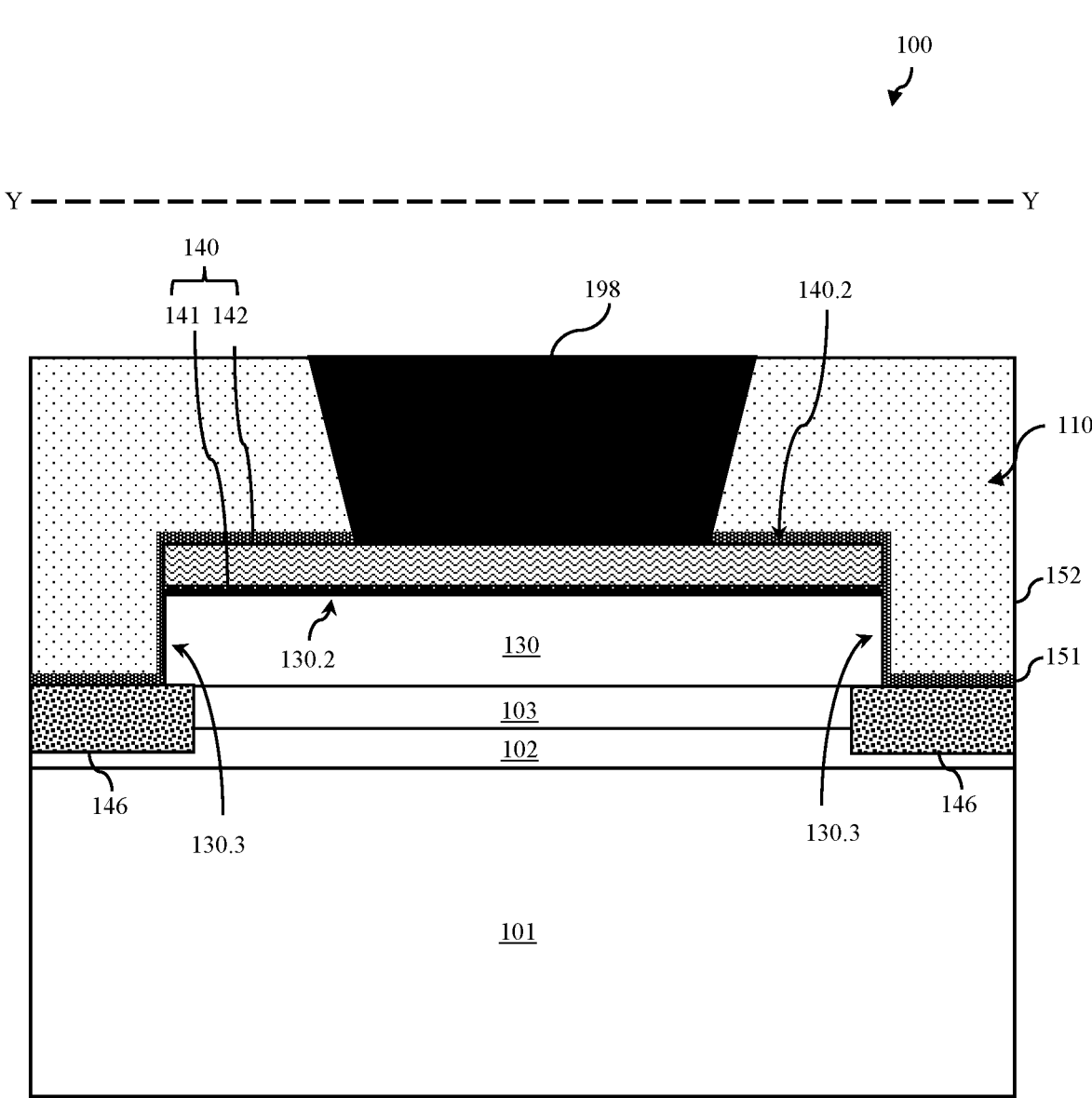

FIG. 1A is a cross-section diagram of a semiconductor structure 100 oriented along the length of a d-mode HEMT 110 included therein and having a multi-gate structure. FIG. 1B and FIG. 1C are cross-section diagrams of the semiconductor structure 100 along the width of the d-mode HEMT 110 included therein and illustrating alternative configurations, respectively, for the multi-gate structure, as discussed in greater detail below.

More particularly, referring to FIG. 1A and FIG. 1B or, alternatively, FIG. 1A and FIG. 1C, the semiconductor structure 100 can include a semiconductor substrate 101. The semiconductor substrate 101 can be, for example, a silicon (Si) or Si-based substrate (e.g., a silicon carbide (SiC) substrate), a sapphire substrate, a III-V semiconductor substrate (e.g., a GaN substrate or some other suitable III-V semiconductor substrate) or any other type of semiconductor substrate suitable for forming a III-V semiconductor device thereon.

The semiconductor structure 100 can further include multiple epitaxially grown semiconductor layers on the semiconductor substrate 101. These semiconductor layers can include, for example: an optional buffer layer (not specifically shown) on the top surface of the semiconductor substrate 101; a channel layer 102 on the buffer layer (or substrate); and a barrier layer 103 on the channel layer 102. These epitaxial grown semiconductor layers can be, for example, III-V semiconductor layers. Those skilled in the art will recognize that a III-V semiconductor refers to a compound obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). Specifically, the optional buffer layer can be employed to facilitate growth of the channel layer 102 and to provide for lattice constants of the substrate 101 below and the channel layer 102 above. The buffer layer can be doped or undoped. Optionally, the buffer layer can be carbon-doped. The barrier layer 103 can have a band gap that is wider than the bandgap of the channel layer 102. Those skilled in the art will recognize that the barrier and channel materials can be selected so that a heterojunction is formed at the interface between the two layers, thereby resulting in the formation of a two-dimensional electron gas (2DEG) in the channel layer 102. This 2DEG in the channel layer 102 can provide the conductive pathway for the drifting of charges between the source and the drain.

In some embodiments, the buffer layer could be a carbon-doped gallium nitride (C—GaN) buffer layer or a buffer layer of any other material suitable for use as a buffer layer of a HEMT. The channel layer 102 could be a GaN layer or a III-V semiconductor channel layer made of any other III-V semiconductor compound suitable for use as a channel layer in a HEMT. The barrier layer 103 could be an aluminum gallium nitride (AlGaN) barrier layer or a barrier layer of any other material suitable for use as a barrier layer in a HEMT. For purposes of illustration, the figures and the description above depict the epitaxially grown semiconductor layers (e.g., the buffer layer (not shown); the channel layer 102; and the barrier layer 103) as being single layered structures (i.e., comprising one layer of buffer material, one layer of channel material and one layer of barrier material). However, it should be understood that, alternatively, any one or more of the epitaxially grown layers could be multi-layered structures (e.g., comprising multiple sub-layers of different buffer materials, multiple sub-layers of different III-V semiconductor channel materials and/or multiple sub-layers of different barrier materials).

The semiconductor structure 100 can further include a d-mode HEMT 110 including portions of the barrier and channel layers, as discussed in greater detail below, and the d-mode HEMT 110 can have a multi-gate structure, including both a primary gate 140 and a secondary gate 130, on the barrier layer 103.

The secondary gate 130 can be an e-mode gate. That is, the secondary gate 130 can include a monocrystalline P-type III-V semiconductor layer that has been patterned into an essentially rectangular shaped semiconductor body so that it has a bottom surface adjacent to the barrier layer 103, a top surface 130.2 opposite the bottom surface, opposing sidewalls 130.1, and opposing end walls 130.3. This semiconductor body can extend laterally across an active device region of the HEMT. The P-type III-V semiconductor layer of the secondary gate 130 can, for example, be a Mg-doped GaN layer or any other suitable P-type III-V semiconductor layer. Additionally, the secondary gate 130 can be a floating gate and, more particularly, can be a non-contacted gate such that it is not biasable.

The primary gate 140 can be a d-mode gate that is on the barrier layer 103 and that further wraps over the secondary gate 130. Specifically, the primary gate 140 can include a relatively thin, conformal, gate dielectric layer 141 above and immediately adjacent to the barrier layer 103 and further extending over and immediately adjacent to the secondary gate 130. The primary gate 140 can also include a gate conductor layer 142 on the gate dielectric layer 141. In all embodiments, the gate dielectric layer 141 can be immediately adjacent to the opposing sidewalls 130.1 and top surface 130.2 of the secondary gate 130 and the gate conductor layer 142 can be on the gate dielectric layer 141 opposite the opposing sidewalls 130.2 and the top surface 130.2. Thus, in all embodiments, the primary gate 140 has first portions 140.1 (and, particularly, essentially vertically-oriented portions) on the barrier layer 103 and positioned laterally adjacent to the opposing sidewalls 130.1 of the secondary gate 130 and a second portion 140.2 (and, particularly, an essentially horizontally-oriented portion) on the top surface 130.2 of the secondary gate 130. In other words, the secondary gate 130 is positioned laterally between the first portions 140.1 of the primary gate 140 and below the second portion 140.2 (as shown in FIG. 1A). In some embodiments, the gate dielectric and conductor layers 141-142 can also wrap around the opposing end walls of the secondary gate 130 such that the primary gate 140 also includes third portions 140.3 (and, particularly, additional essentially vertically-oriented portions) on the barrier layer 103 and positioned laterally adjacent to the opposing end walls 130.3 of the secondary gate 130, as shown in FIG. 1B. In other embodiments, the primary gate 140 can be patterned so that the opposing end walls 130.3 of the secondary gate 130 are devoid of the gate dielectric and conductor materials, as shown in FIG. 1C.

In any case, in the primary gate 140, the gate dielectric layer 141 of the primary gate 140 can include one or more layers of gate dielectric material(s). The gate dielectric material could be, for example, a high dielectric constant (K) dielectric material. Those skilled in the art will recognize that a high-K dielectric material is a dielectric material having a K value that is greater than that of silicon dioxide ($SiO_2$). Such high-K dielectric materials include, but are not limited to, hafnium (Hf)-based dielectric materials (e.g., hafnium oxide, hafnium silicon oxide, hafnium silicon oxynitride, hafnium aluminum oxide, etc.) and various other dielectric materials ((e.g., aluminum oxide ($Al_2O_3$), tantalum oxide ($Ta_2O_5$), zirconium oxide ($ZrO_2$), etc.). Alternatively, the gate dielectric material could be any other dielectric material suitable for use as a gate dielectric layer in a HEMT (e.g., $SiO_2$, etc.). Additionally, in the primary gate 140, the gate conductor layer 142 of the primary gate 140 can include one or more layers of gate conductor material(s). The gate conductor material could, for example, be a metallic gate conductor material. That is, it could include one or more metal(s) or metal alloy(s) including, but not limited to, gold (Au), titanium (Ti), titanium nitride (TiN), nickel-gold (Ni—Au), or titanium-platinum-gold (Ti/Pt/Au).

A relatively thin conformal dielectric layer 151 can cover the primary gate 140 and extend laterally over the barrier layer 103 on either side of the primary gate 140. The dielectric layer 151 can, for example, be an etch stop layer, such as a silicon nitride layer or a layer of some other suitable etch stop material. As illustrated in FIG. 1C, in an embodiment where the opposing end walls 130.3 of the secondary gate 130 are devoid of the gate dielectric and conductor materials of the primary gate 140, this conformal dielectric layer 151 can also be positioned laterally immediately adjacent to and can cover the opposing end walls 130.3 of the secondary gate 130.

As shown in FIG. 1A, the d-mode HEMT 110 can also include can include source and drain terminals 121-122 with the multi-gate structure (including the primary and secondary gates) being positioned laterally between the source and drain terminals 121-122. More specifically, the source and drain terminals 121-122 can be on opposing sides of the primary gate 140 such that they are adjacent (but physically separated from) the first portions 140.1, respectively, thereof. The source and drain terminals 121-122 can be separated from the multi-gate structure by essentially the same separation distances, as illustrated, or by different separation distances (e.g., the drain terminal 122 could be separated from the gate by a greater separation distance than the source terminal 121 for increased breakdown voltage). The source and drain terminals 121-122 can, for example, include ohmic contact source and drain terminals in source/drain openings that extend through the dielectric layer 151 and into the barrier layer 103 toward or to the channel layer 102. That is, the source/drain openings can extend through the dielectric layer and at least partially through the barrier layer toward the channel layer. In some embodiments, the source and drain terminals can be essentially T-shaped, each with a lower section in a source/drain opening and an upper section on and wider than the lower section (e.g., extending laterally onto the dielectric layer), as illustrated. Such ohmic contact source and drain terminals can include one or more layers of metal or metal alloys (e.g., such ohmic contact source and drain terminals include, but are not limited to, multi-layer structures of Ti/Al/TiN, Ti/Al/Ti/Au or Mo/Al/Mo/Au). It should be noted that the source and drain terminal configurations are provided above for illustration purposes and are not intended to be limiting. Alternatively, any other suitable source and drain terminal configuration for a HEMT could be employed.

Optionally, in order to block a current path between the source and drain terminals 121-122 around the ends of the multi-gate structure, the semiconductor structure 100 can further include isolation regions 146 located adjacent the ends of the multi-gate structure, as illustrated in FIG. 1B or, alternatively, FIG. 1C. For example, in an embodiment where the primary gate 140 includes third portions 140.3 positioned laterally adjacent to the opposing end walls 130.3 of the secondary gate 130, as shown in FIG. 1B, the isolation regions 146 can be below and wider than the opposing end walls 130.3 of the secondary gate 130, can extend vertically through the barrier layer 103 into and, optionally, completely through the channel layer 102, and can further extend laterally beyond the third portions 140.3 of the primary gate 140. In other embodiments where the primary gate 140 doesn't include the third portions 140.3 at the opposing end walls 130.3 of the secondary gate 130, as shown in FIG. 1C, the isolation regions 146 can be below and wider than the opposing end walls 130.3 of the secondary gate 130, can extend vertically through the barrier layer 103 into and, optionally, completely through the channel layer 102, and can further extend laterally some distance beyond the opposing end walls of the secondary gate 130. In any case, the isolation regions 146 can be semiconductor material areas that contain and, particularly, that have been doped with a dopant, such as argon (Ar), to eliminate charge build up and thereby block any potential current path(s) between the source and drain terminals 121-122 that would otherwise bypass the portion of the channel layer below the multi-gate structure by wrapping around the end(s) of the multi-gate structure. As discussed in greater detail below with regard to the method embodiments, such isolation regions can be formed using a dopant implantation process and, thus, are also referred to herein as dopant implant isolation regions. It should be noted that, alternatively, these isolation regions 146 can have any other suitable configuration for blocking current paths between the source and drain terminals 121-122 around the multi-gate structure.

As illustrated in FIG. 1A and in FIG. 1B or, alternatively, in FIG. 1C, the semiconductor structure 100 can further include one or more layers of middle of the line (MOL) dielectric material 152 over the d-mode HEMT 110. For example, the MOL dielectric material 152 can, optionally, include a relatively thin, conformal, dielectric layer. This dielectric layer could be another etch stop layer (e.g., another silicon nitride layer). The MOL dielectric material 152 can also include a blanket layer of interlayer dielectric (ILD) material. The ILD material can be, for example, $SiO_2$, doped silicon glass (e.g., phosphosilicate glass (PSG) or borophosphosilicate glass (BPSG)), or any other suitable ILD material. Additionally, the semiconductor structure 100 can further include MOL contacts that extend through the MOL dielectric material to the HEMT terminals (e.g., see the MOL contact 198 to the primary gate 140 and the MOL contacts 199 to the source and drain terminals 121-122). Since, as mentioned above, the secondary gate 130 of the d-mode HEMT 110 can be left floating, no MOL contacts extend to the secondary gate 130.

Also disclosed herein are method embodiments for forming a semiconductor structure, such as the semiconductor structure 100 of FIG. 1A and FIG. 1B or, alternatively, FIG. 1A and FIG. 1C, described in detail above.

The method embodiments can include forming a stack of epitaxially grown semiconductor layers on a semiconductor substrate 101, as illustrated in FIG. 2. The semiconductor substrate 101 can be, for example, a Si or Si-based substrate (e.g., a SiC substrate), a sapphire substrate, a III-V semiconductor substrate (e.g., a GaN substrate or some other suitable III-V semiconductor substrate) or any other semiconductor substrate suitable for forming a III-V semiconductor device thereon. The multiple epitaxially grown semiconductor layers can include, for example: an optional buffer layer (not specifically shown) on the top surface of the semiconductor substrate 101; a channel layer 102 on the buffer layer (or substrate); and a barrier layer 103 on the channel layer 102. These epitaxial grown semiconductor layers can be, for example, III-V semiconductor layers. Those skilled in the art will recognize that a III-V semiconductor refers to a compound obtained by combining group III elements, such as Al, Ga, or In, with group V elements, such as N, P, As or Sb) (e.g., GaN, InP, GaAs, or GaP).

In some embodiments, the buffer layer could be a C—GaN buffer layer or a buffer layer of any other material suitable for use as a buffer layer of a HEMT. The channel layer 102 could be a GaN layer or a III-V semiconductor channel layer made of any other III-V semiconductor compound suitable for use as a channel layer in a HEMT. The barrier layer 103 could be an AlGaN barrier layer or a barrier layer of any other material suitable for use as a barrier layer in a HEMT. For purposes of illustration, the figures and the description above depict the epitaxially grown semiconductor layers (e.g., the buffer layer (not shown); the channel layer 102; and the barrier layer 103) as being single layered structures (i.e., comprising one layer of buffer material, one layer of channel material and one layer of barrier material). However, it should be understood that, alternatively, any one or more of the epitaxially grown layers could be multi-layered structures (e.g., comprising multiple sub-layers of different buffer materials, multiple sub-layers of different III-V semiconductor channel materials and/or multiple sub-layers of different barrier materials).

Figure 4A:
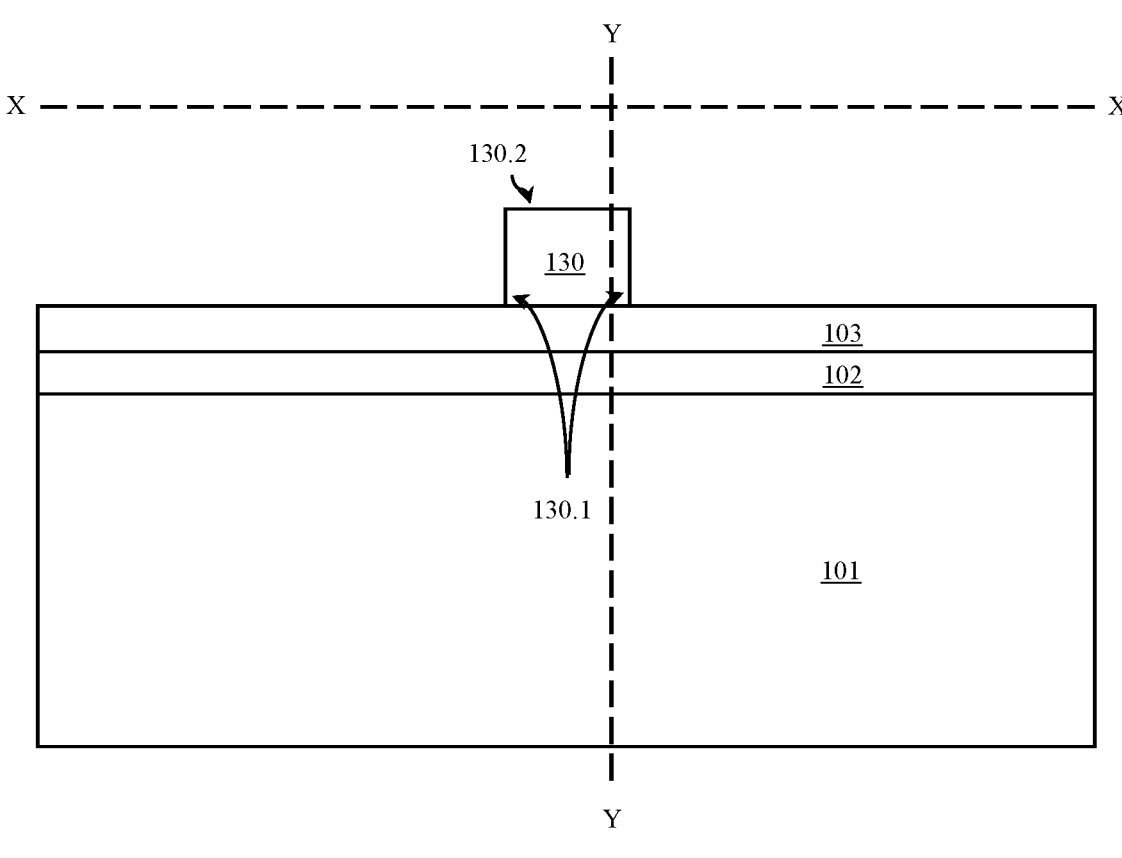
FIGS. 4A and 4B are cross-section diagrams illustrating a partially completed semiconductor structure formed according to the disclosed methods.
Figure 4B:
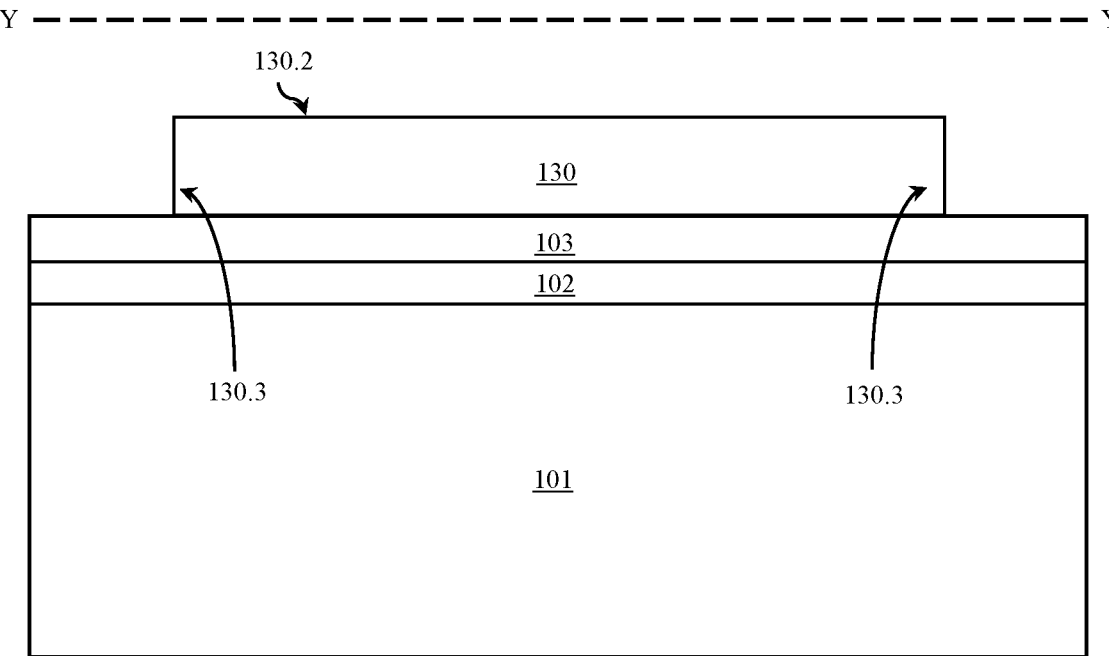

The method embodiments can further include forming a secondary gate 130 on the barrier layer 103 (see FIG. 3 and FIGS. 4A-4B). For example, a monocrystalline III-V semiconductor layer can be formed (e.g., epitaxially grown) on the barrier layer 103 (see FIG. 3). This III-V semiconductor layer can either be in situ doped or subsequently implanted so that it has P-type conductivity. In some embodiments, the P-type III-V semiconductor layer can be a MG-doped GaN layer. Subsequently, an essentially rectangular-shaped P-type III-V semiconductor body for the secondary gate 130 can be formed from the P-type III-V semiconductor layer (e.g., using conventional lithographic patterning and etch techniques) such that it traverses a designated active device region for the d-mode HEMT (e.g., see FIGS. 4A-4B). The resulting secondary gate 130 can have a bottom surface immediately adjacent to the barrier layer, a top surface 130.2 opposite the bottom surface, opposing sidewalls 130.1, and opposing end walls 130.3.

Figure 5A:
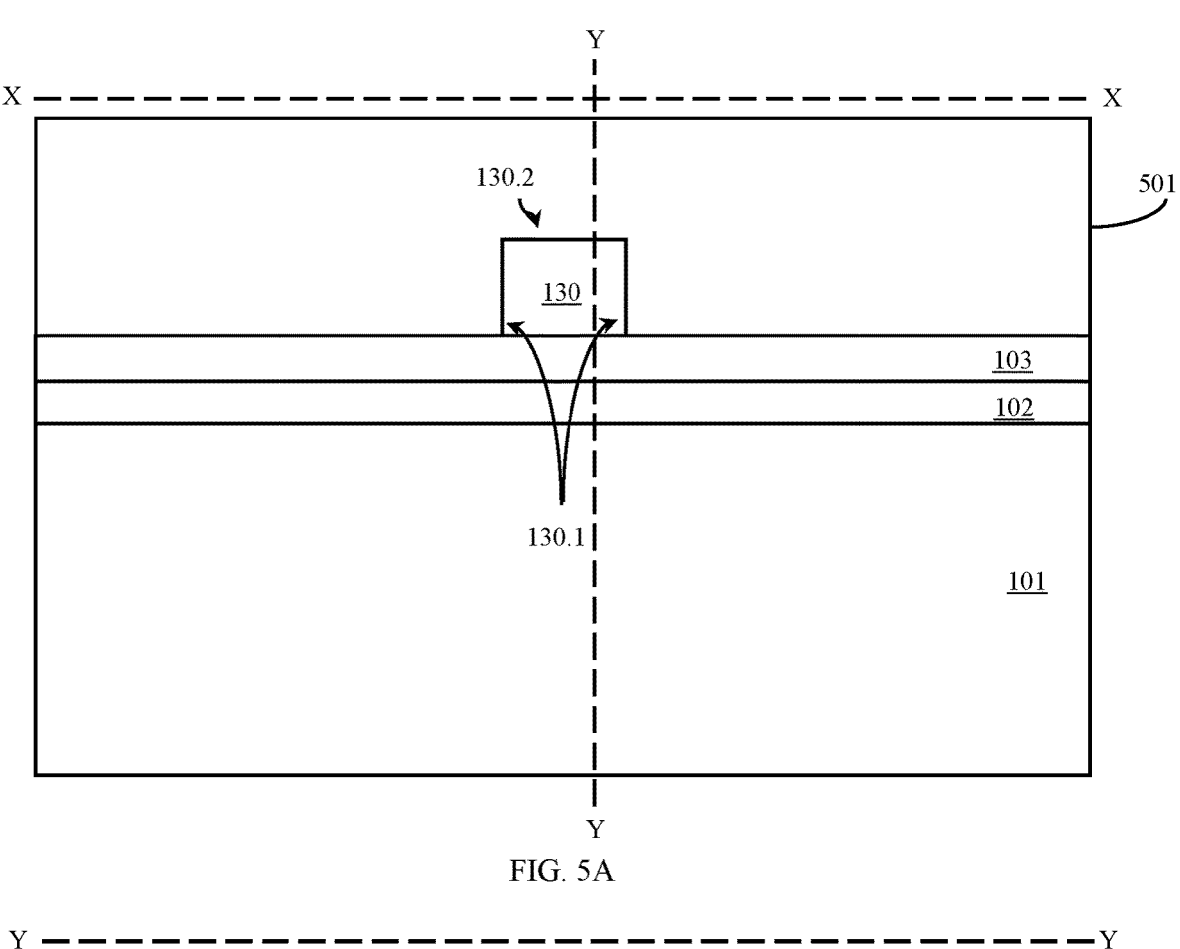
FIGS. 5A and 5B are cross-section diagrams illustrating a partially completed semiconductor structure formed according to the disclosed methods.
Figure 5B:
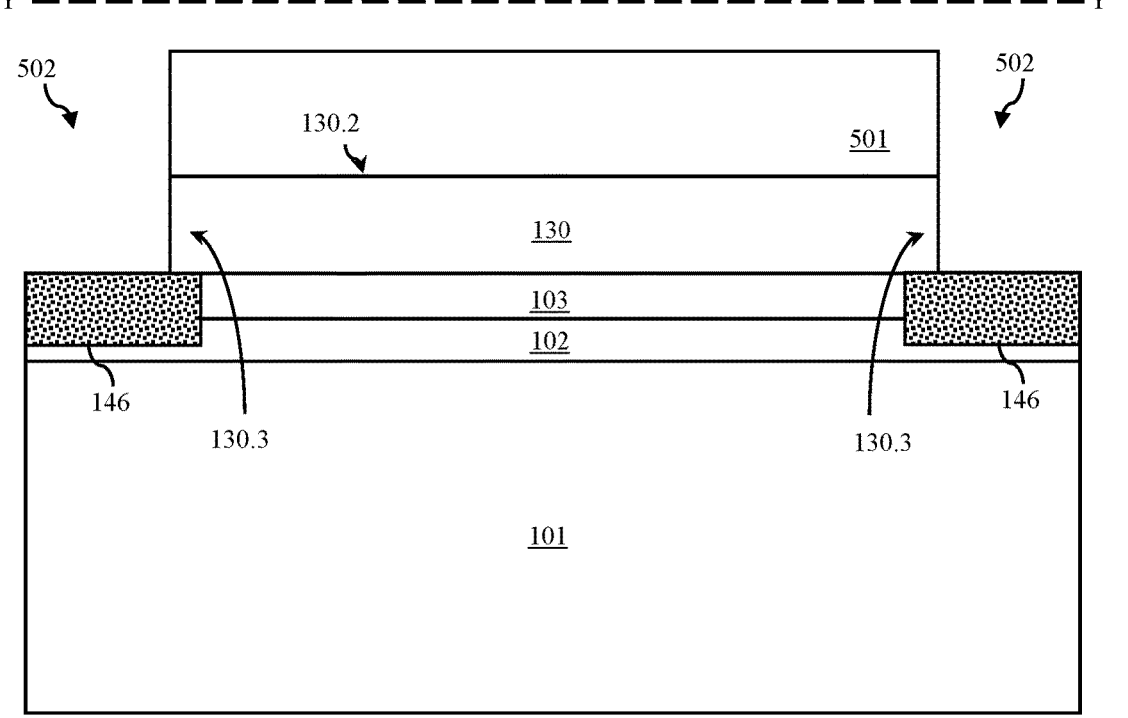

Optionally, the method embodiments can further include, following formation of the secondary gate 130, forming isolation regions 146 (e.g., implant isolation regions), as illustrated in FIGS. 5A-5B. Specifically, a mask 501 (e.g., a hardmask layer, such as a silicon nitride (SiN) hardmask layer) can be formed over the partially completed structure and lithographically patterned and etched so as to form openings 502 in the mask 501 that expose only areas of the barrier layer 103 that extend laterally beyond the opposing end walls 130.3 of the secondary gate 130. Then, a dopant implantation process can be performed to implant a dopant, such as Ar, into areas of the barrier layer 103 and further into and, optionally, through areas of the channel layer 102 aligned below the openings 502, thereby forming the isolation regions 146. The mask 501 can then be removed.

Figure 6A:
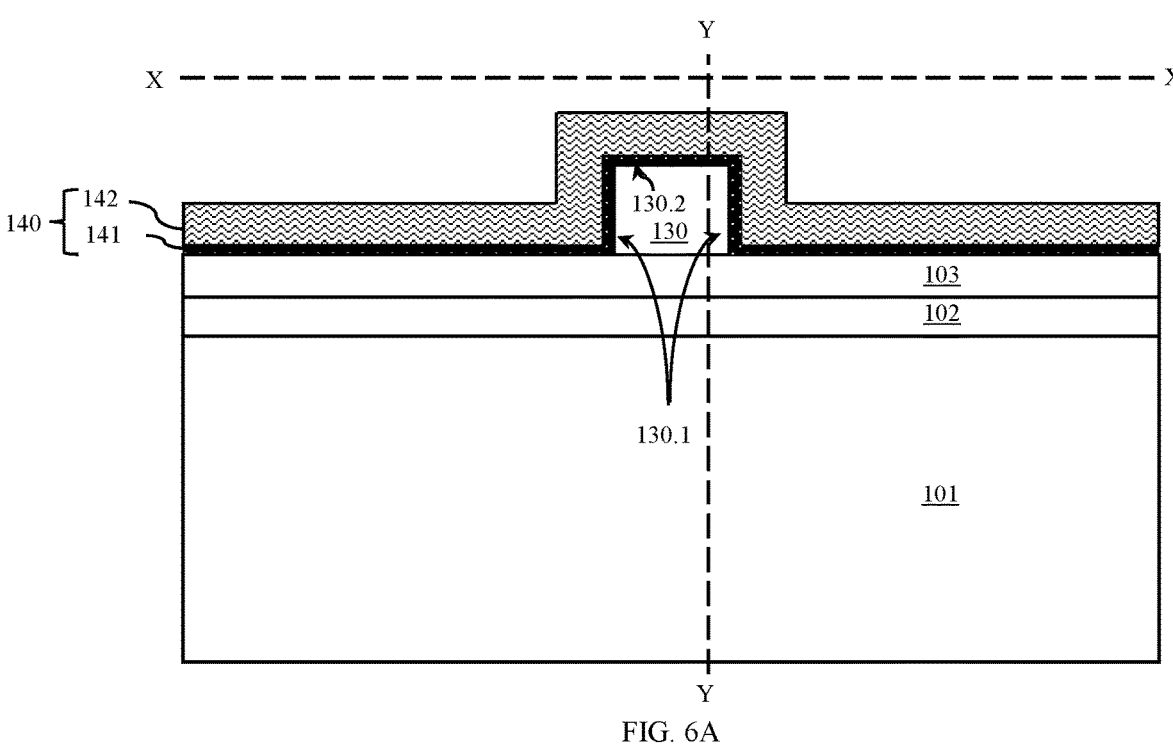
FIGS. 6A and 6B are cross-section diagrams illustrating a partially completed semiconductor structure formed according to the disclosed methods.
Figure 6B:
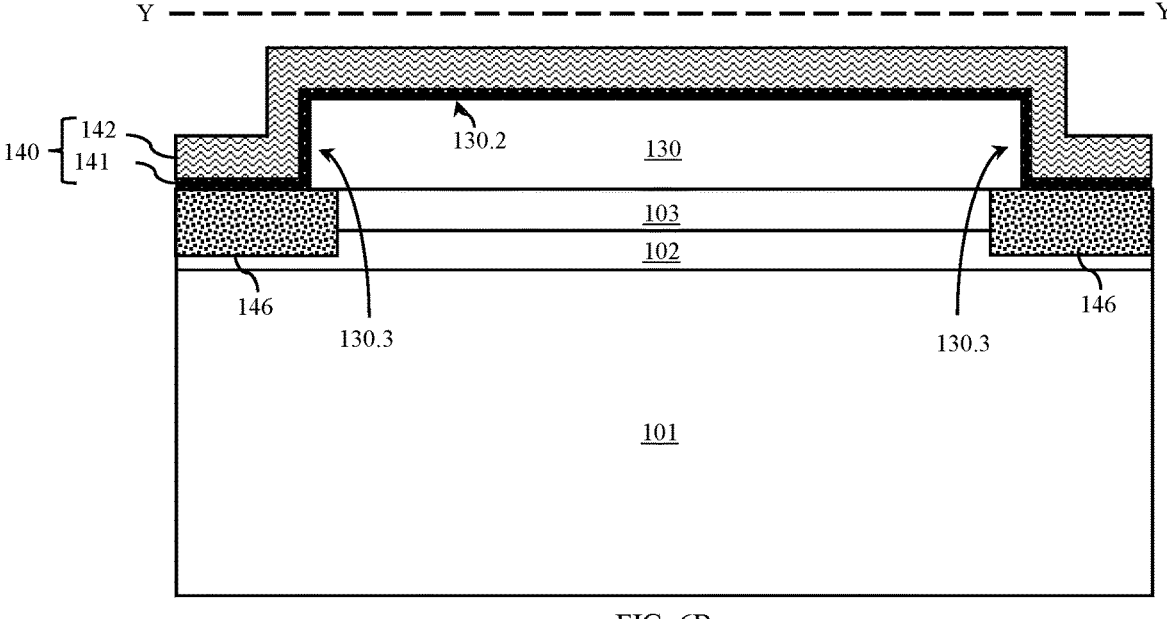

The method embodiments can further include forming a primary gate 140. For example, a gate dielectric layer 141, including one or more layers of gate dielectric material(s), can be formed (e.g., deposited) over the partially completed semiconductor structure (see FIGS. 6A-6B). The gate dielectric material could be, for example, a high-K dielectric material. As discussed above, high-K dielectric materials can include, but are not limited to, Hf-based dielectric materials and various other dielectric materials (e.g., $Al_2O_3$, $Ta_2O_5$, $ZrO_2$, etc.). Alternatively, the gate dielectric material could be any other dielectric material suitable for use as a gate dielectric layer in a HEMT (e.g., $SiO_2$, etc.). Additionally, a gate conductor layer 142, including one or more layers of gate conductor material(s), can be formed (e.g., deposited) on the gate dielectric layer 141, thereby forming a gate stack (see FIGS. 6A-6B). The gate conductor material could, for example, be a metallic gate conductor material. That is, it could include one or more metal(s) or metal alloy(s) including, but not limited to, Au, Ti, TiN, Ni—Au, or Ti/Pt/Au. Techniques for forming (e.g., depositing) such gate dielectric and gate conductor materials are well known in the art and, thus, the details have been omitted in order to allow the reader to focus on the salient aspects of the disclosed embodiments.

Figures 7A, 7B:
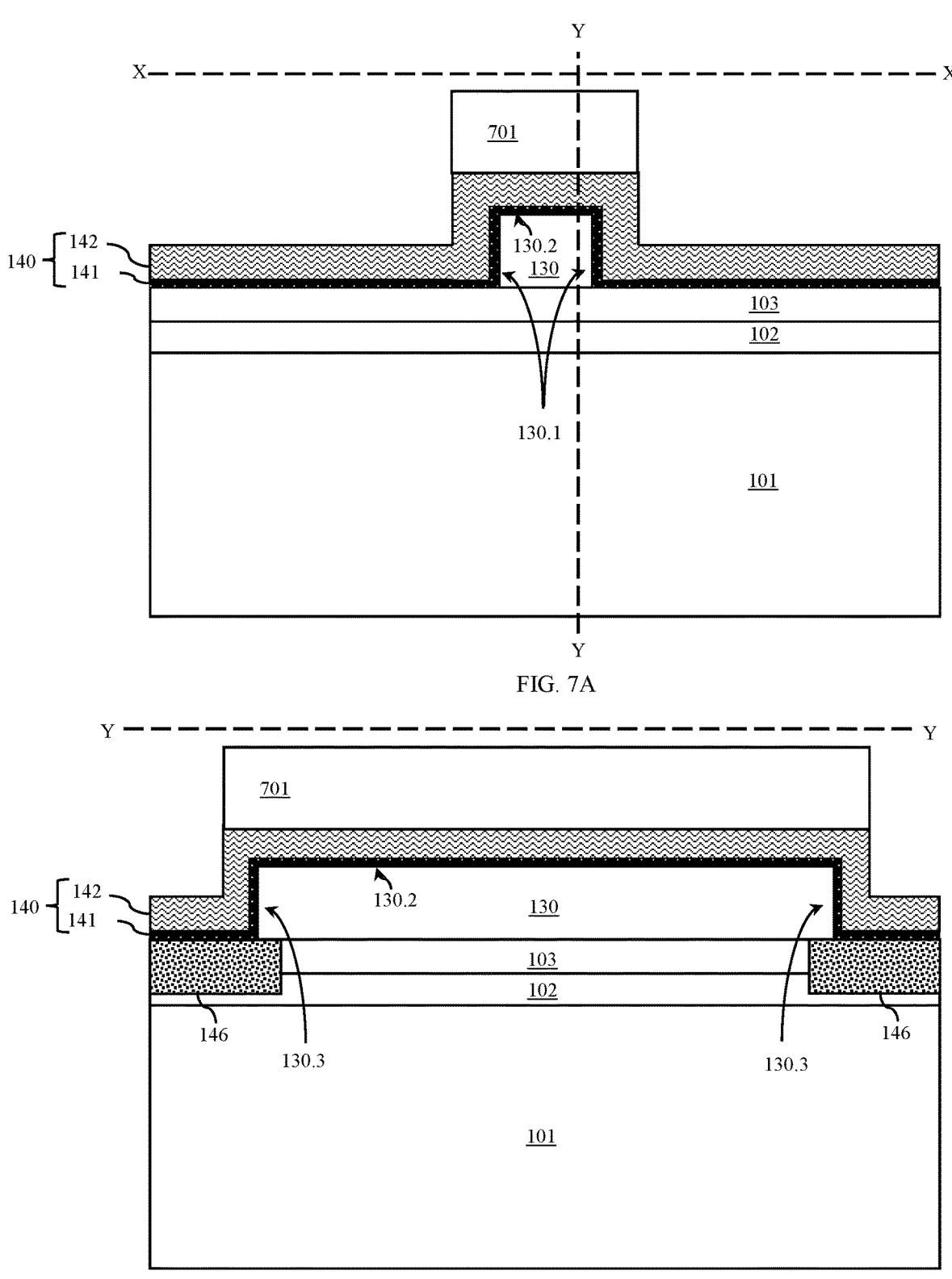
FIG. 7A is a cross-section diagram illustrating a partially completed semiconductor structure formed according to the disclosed methods and FIGS. 7B and 7C are alternative cross-section diagrams of the partially completed structure of FIG. 7A.
Figure 7C:
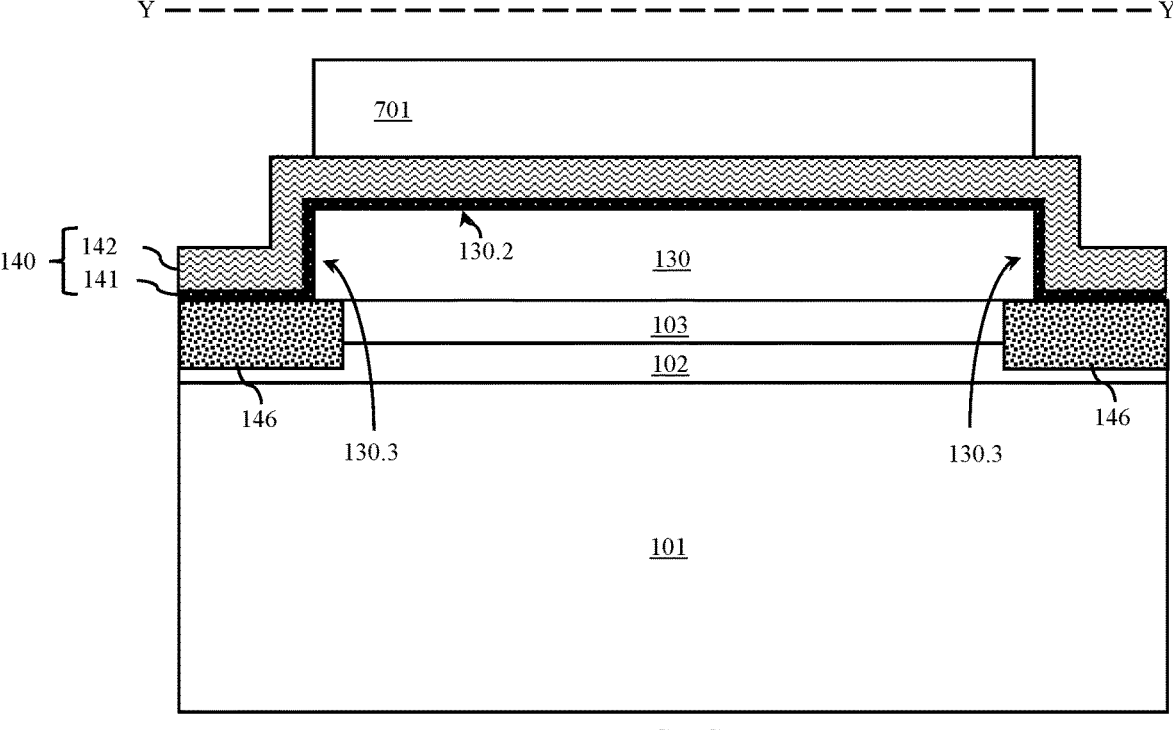
Figure 8A:
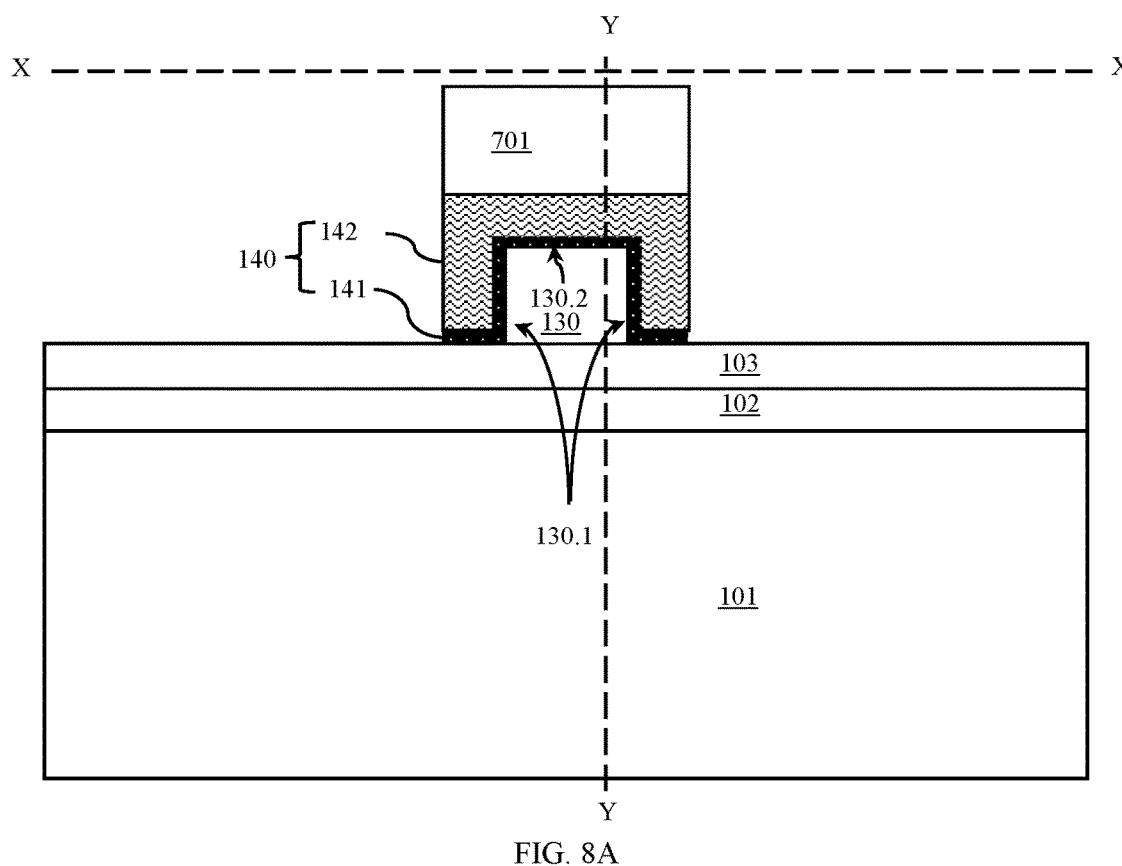
FIG. 8A is a cross-section diagram illustrating a partially completed semiconductor structure formed according to the disclosed methods and FIGS. 8B and 8C are alternative cross-section diagrams of the partially completed structure of FIG. 8A.

The primary gate 140 can then be formed from this gate stack (e.g., using conventional lithographic patterning and etch techniques). For example, another mask 701 (e.g., another hardmask layer, such as a silicon nitride hardmask layer) can be formed over the partially completed structure and lithographically patterned and etched so as to define the shape of the primary gate and exposing areas of the gate conductor material that are to be removed. As illustrated in FIG. 7A, the mask 701 can be patterned and etched so that it is aligned above and longer than the gate length of the secondary gate 130 (as measured in the XX direction) and, thus, so that it extends beyond the opposing sidewalls 130.2 of the secondary gate 130. As illustrated in FIG. 7B, in some embodiments (e.g., during formation of the semiconductor structure 100 with the cross-section shown in FIG. 1B), the mask 701 can also be wider than the gate width of the secondary gate 130 (as measured in the YY direction) and, thus, can extend laterally beyond the opposing end walls 130.3 of the secondary gate 130. Alternatively, as illustrated in FIG. 7C, in other embodiments (e.g., during formation of the semiconductor structure 100 with the cross-section shown in FIG. 1C), the mask 701 can be the same width as or narrower than the gate width of the secondary gate 130 (as measured in the YY direction) and, thus, does not extend beyond the opposing end walls 130.3 of the secondary gate 130. An anisotropic etch process can then be performed to remove the exposed portions of the gate conductor layer 142 and, optionally, the gate dielectric layer 141 below to complete the primary gate 140 (see FIG. 8A and FIG. 8B or, alternatively, FIG. 8A and FIG. 8C). As illustrated, depending on the size of the mask 701, the opposing end walls of the secondary gate may remain covered (see FIG. 8B) or may be exposed (see FIG. 8C).

Figure 8B:
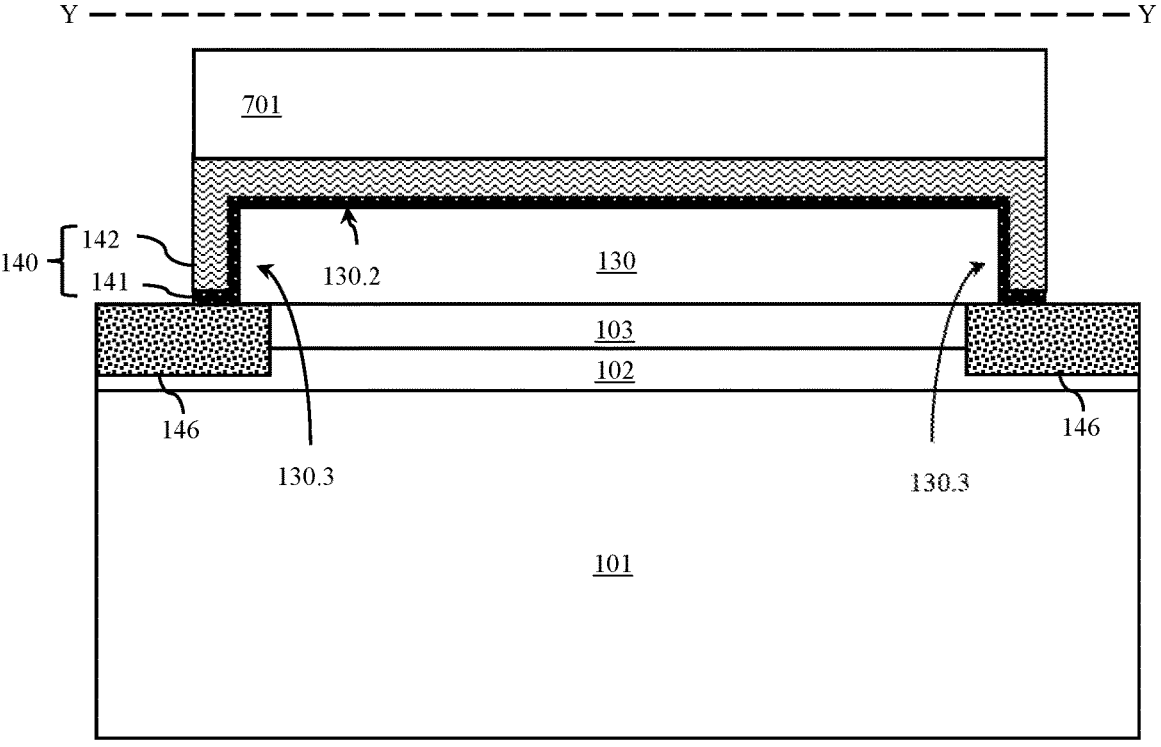
Figure 8C:
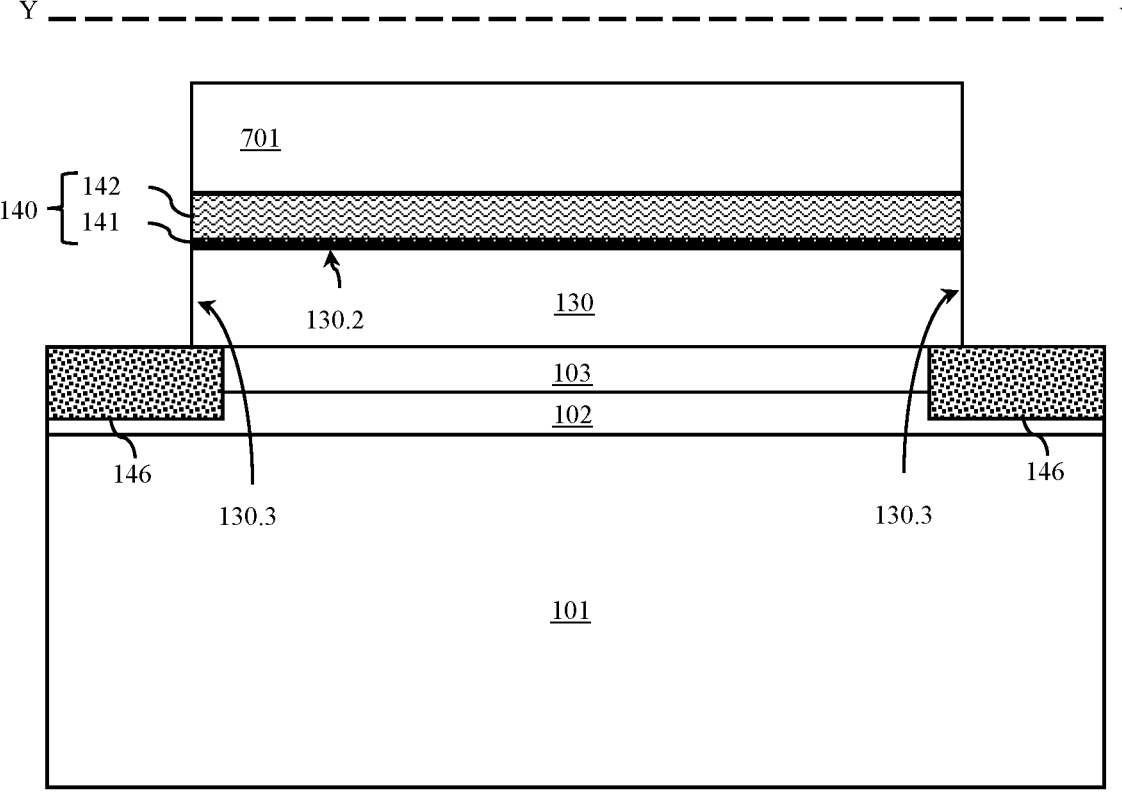
Figure 9A:
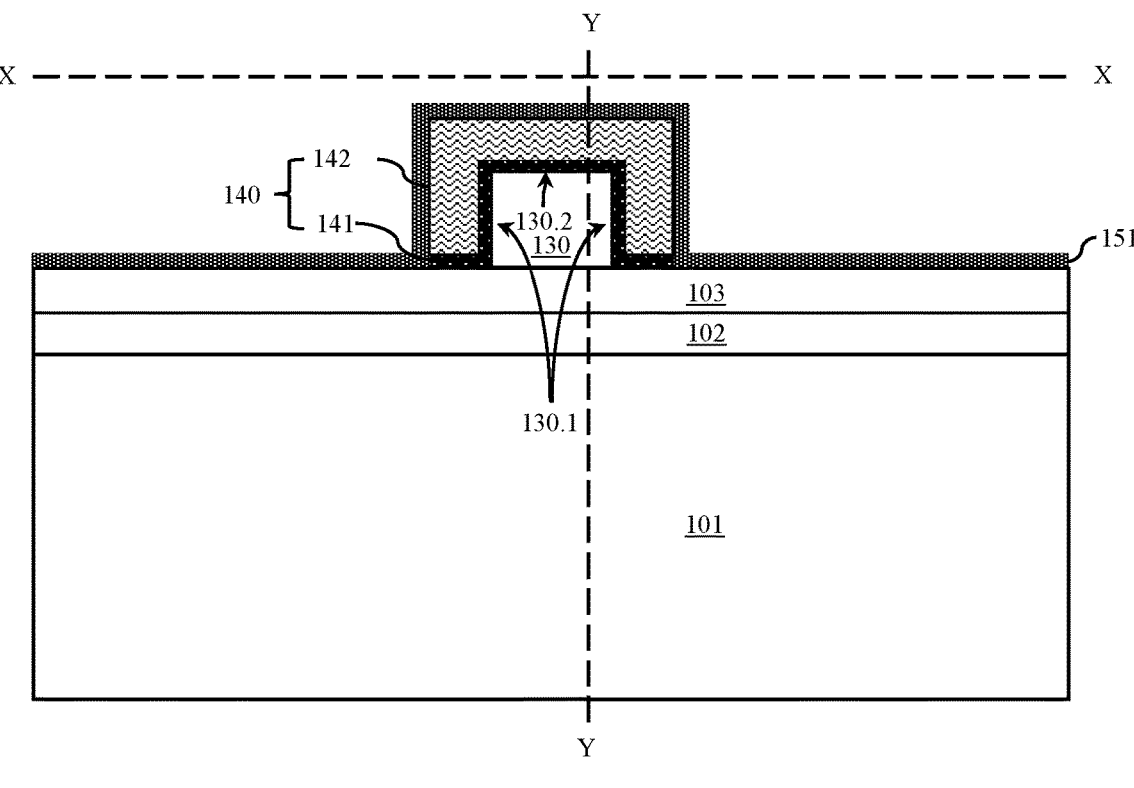
FIG. 9A is a cross-section diagram illustrating a partially completed semiconductor structure formed according to the disclosed methods and FIGS. 9B and 9C are alternative cross-section diagrams of the partially completed structure of FIG. 9A.
Figure 9B:
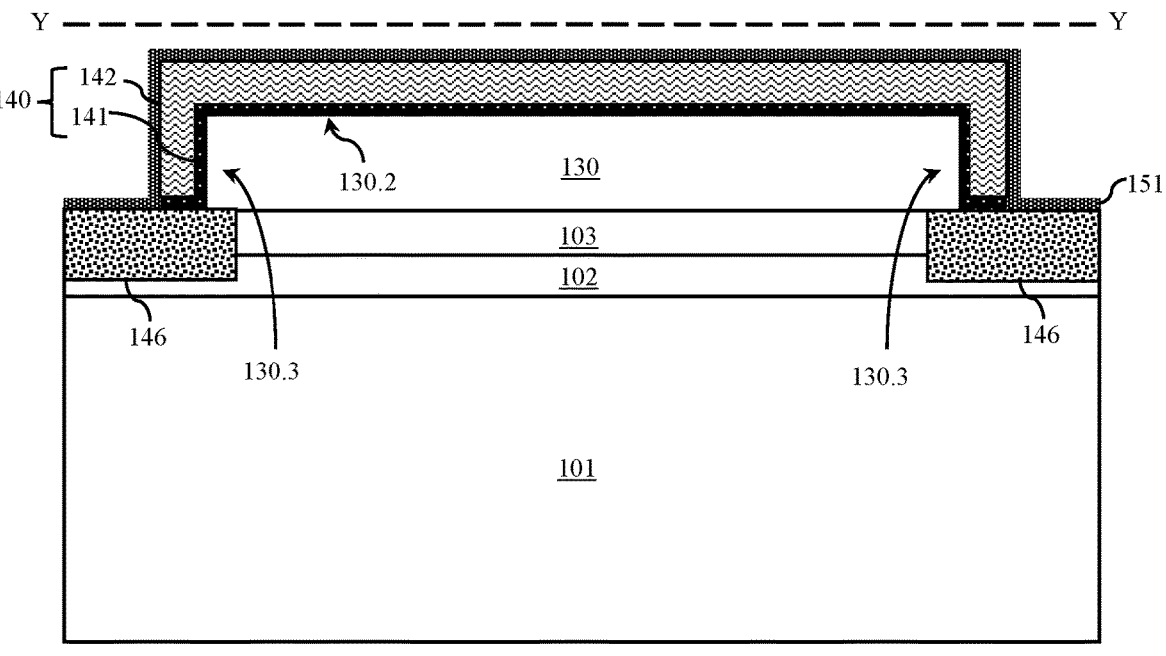
Figure 9C:
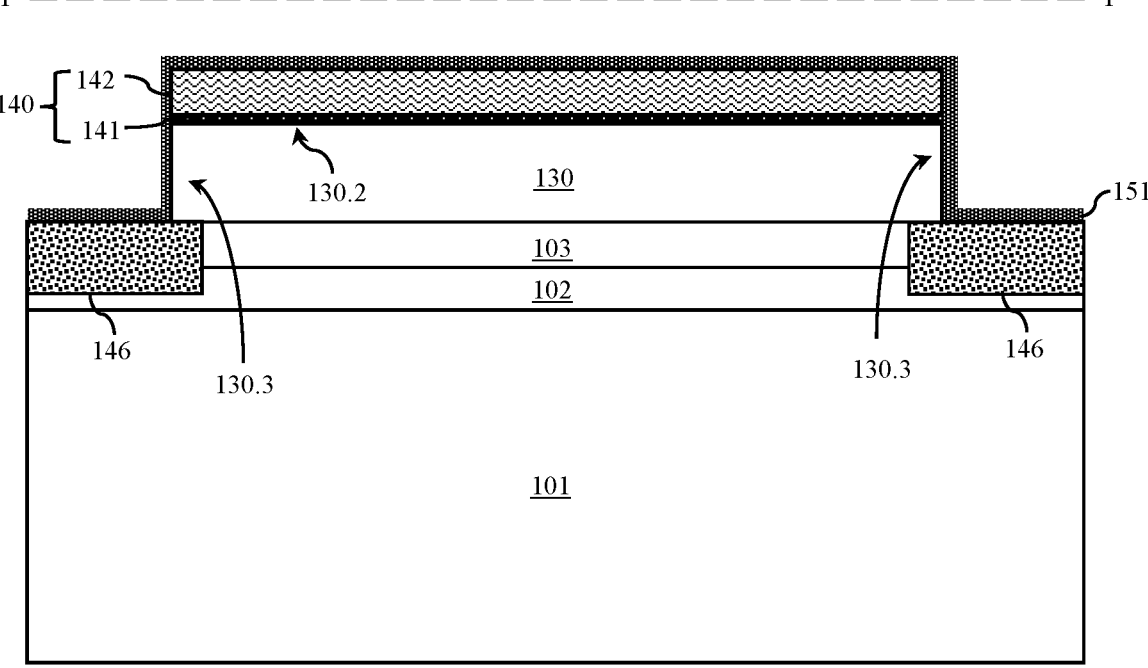

Following completion of the primary gate 140, a relatively thin conformal dielectric layer 151 (e.g., a conformal etch stop layer, such as a conformal SiN etch stop layer or a conformal layer of some other suitable etch stop material) can be formed over the partially completed structure (see FIG. 9A and FIG. 9B or, alternatively, FIG. 9C). It should be noted that if the primary gate 140 includes third portion 140.3 adjacent to the opposing end walls 130.3 of the secondary gate 130 (e.g., as shown in FIG. 8B), then the conformal dielectric layer 151 will be physically separated from the secondary gate 130 on all sides (e.g., as shown in FIG. 9B); whereas, if the gate conductor and dielectric materials are completely removed from the opposing end walls of the secondary gate 130 (e.g., as shown in FIG. 8C), then the conformal dielectric layer 151 will be immediately adjacent to and cover the opposing end walls 130.3 (e.g., as shown in FIG. 9C).

Additional processing to complete the HEMT 110 can include formation of source and drain terminals 121-122. In some embodiments, formation of the source and drain terminals 121-122 can include forming source and drain openings (e.g., using lithographic patterning and etch processes). The source and drain openings can be formed so that they are parallel to and on opposing sides of the multi-gate structure (e.g., separated from the multi-gate structure by the same separation distance or by different separation distances). The source and drain openings can be formed so that they that extend through the dielectric layer 151 and into the barrier layer 103 toward or to the channel layer 102. One or more layers of metal or metal alloys can then be deposited over the partially completed structure so as to fill the openings. These layers can be selected to form ohmic contact source and drain terminals and can include, for example, Ti/Al/TiN, Ti/Al/Ti/Au or Mo/Al/Mo/Au. The stack of metal or metal alloy layers can then be patterned (e.g., lithographically patterned and etched) to form the discrete source and drain terminals 121-122 (e.g., T-shaped source and drain terminals). Alternatively, any other suitable technique for forming source and drain terminals could be employed.

Then, as illustrated in FIG. 1A and FIG. 1B or, alternatively, FIG. 1A and FIG. 1C, using conventional MOL processing techniques, one or more layers of MOL dielectric material 152 (e.g., an etch stop layer, a blanket ILD material, etc., as discussed in greater detail above with regard to the structure embodiments) can be formed over the partially completed structure and MOL contacts can be formed. The MOL contacts can specifically be formed so that they extend essentially vertically through the MOL dielectric material to the HEMT terminals (e.g., see the MOL contact 198 to the primary gate 140 and the MOL contacts 199 to the source and drain terminals 121-122). However, as mentioned above, in the disclosed embodiments, the secondary gate 130 of the d-mode HEMT 110 can be left floating. Thus, as illustrated, no MOL contacts are formed to the secondary gate 130.

It should be understood that in the structures and method described above, a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a substrate; and
   a transistor on the substrate, wherein the transistor includes:
      a barrier layer;
      a secondary gate on the barrier layer and having opposing sidewalls; and
      a primary gate having first portions on the barrier layer and positioned laterally adjacent to the opposing sidewalls, respectively, wherein the primary gate includes:
         a gate dielectric layer immediately adjacent to the barrier layer and further extending over and immediately adjacent to the secondary gate; and
         a gate conductor layer on the gate dielectric layer; and
      a conformal dielectric layer on a top surface of the gate conductor layer, positioned laterally adjacent to aligned vertical surfaces of the gate conductor layer and the gate dielectric layer, and including a different dielectric material than the gate dielectric layer.

2. The structure of claim 1, wherein the secondary gate is a floating gate.

3. The structure of claim 1, wherein the secondary gate includes a P-type III-V semiconductor layer.

4. The structure of claim 3, wherein the P-type III-V semiconductor layer includes a magnesium-doped gallium nitride layer.

5. The structure of claim 3, wherein the conformal dielectric layer includes a silicon nitride layer.

6. The structure of claim 5, wherein the gate dielectric layer includes a high dielectric constant material, and the gate conductor layer includes a metallic gate conductor material.

7. The structure of claim 1, wherein the transistor further includes:
   a channel layer, wherein the barrier layer is on the channel layer; and source and drain terminals extending through the conformal dielectric layer and at least partially through the barrier layer toward the channel layer, wherein the primary gate and the secondary gate are positioned laterally between the source and drain terminals.

8. The structure of claim 1,
   wherein the secondary gate further includes a top surface and opposing end walls,
   wherein the primary gate further has a second portion on the top surface of the secondary gate and third portions positioned laterally adjacent to the opposing end walls of the secondary gate, and
   wherein the structure further includes:
      isolation regions below the opposing end walls of the secondary gate, extending vertically through the barrier layer into a channel layer, and extending laterally beyond the third portions of the primary gate.

9. The structure of claim 1,
   wherein the secondary gate further has a top surface and opposing end walls,
   wherein the primary gate further has a second portion on the top surface of the secondary gate, and
   wherein the structure further includes:
      the conformal dielectric layer immediately adjacent to the opposing end walls of the secondary gate; and
      isolation regions below the opposing end walls and extending vertically through the barrier layer into a channel layer.

10. A structure comprising:
   a substrate; and
   a transistor on the substrate, wherein the transistor includes:
      a barrier layer;
      a secondary gate on the barrier layer and having opposing sidewalls, opposing end walls and a top surface, wherein the secondary gate includes a P-type III-V semiconductor layer and is floating; and
      a primary gate including:
         a gate dielectric layer immediately adjacent to the barrier layer and further extending over and immediately adjacent to the opposing sidewalls, the opposing end walls, and the top surface of the secondary gate; and
         a gate conductor layer on the gate dielectric layer,
      wherein the primary gate has first portions on the barrier layer and positioned laterally adjacent to the opposing sidewalls, respectively, of the secondary gate, a second portion on the top surface of the secondary gate, and third portions on the barrier layer and positioned laterally adjacent to the opposing end walls, respectively, of the secondary gate; and
   a conformal dielectric layer on a top surface of the gate conductor layer, positioned laterally adjacent to aligned vertical surfaces of the gate conductor layer and the gate dielectric layer, and including a different dielectric material than the gate dielectric layer.

11. A method comprising:
   providing a substrate; and
   forming a transistor on the substrate, wherein the forming of the transistor includes:
      forming a secondary gate on a barrier layer; and
      forming a primary gate having first portions on the barrier layer and positioned laterally adjacent to opposing sidewalls, respectively, of the secondary gate, wherein the primary gate includes:

a gate dielectric layer immediately adjacent to the barrier layer and further extending over and immediately adjacent to the secondary gate; and a gate conductor layer on the gate dielectric layer; and forming a conformal dielectric layer on a top surface of the gate conductor layer, positioned laterally adjacent to aligned vertical surfaces of the gate conductor layer and the gate dielectric layer, and including a different dielectric material than the gate dielectric layer.

12. The method of claim 11, wherein the forming of the secondary gate includes:

forming a P-type III-V semiconductor layer on the barrier layer; and forming, from the P-type III-V semiconductor layer, an essentially rectangular-shaped semiconductor body to form the secondary gate.

13. The method of claim 12, wherein the P-type III-V semiconductor layer includes a magnesium-doped gallium nitride layer.

14. The method of claim 11, wherein the forming of the transistor further includes forming isolation regions in the barrier layer below opposing end walls of the secondary gate and extending vertically through the barrier layer into a channel layer.

15. The method of claim 11, wherein the forming of the primary gate includes:

forming the gate dielectric layer immediately adjacent to the barrier layer and further extending over and immediately adjacent to the opposing sidewalls, opposing end walls, and a top surface of the secondary gate;

forming the gate conductor layer on the gate dielectric layer to form a gate stack; and patterning the gate stack to form the primary gate.

16. The method of claim 15, wherein the patterning is performed such that the primary gate has the first portions positioned laterally adjacent to the opposing sidewalls, respectively, of the secondary gate, a second portion on the top surface of the secondary gate, and third portions positioned laterally adjacent to the opposing end walls, respectively, of the secondary gate.

17. The method of claim 15, wherein the patterning is performed such that the primary gate has the first portions positioned laterally adjacent to the opposing sidewalls, respectively, of the secondary gate and a second portion on the top surface of the secondary gate and further such that the opposing end walls, respectively, of the secondary gate are exposed.

18. The method of claim 15, wherein the gate dielectric layer includes a high dielectric constant material, and the gate conductor layer includes a metallic gate conductor material.

19. The method of claim 11, further including performing middle of the line processing, wherein the performing of the middle of the line processing does not include forming contacts to the secondary gate so the secondary gate remains floating.

20. The method of claim 11, wherein the forming of the transistor further includes:

forming a channel layer;

forming the barrier layer on the channel layer; and forming source and drain terminals extending through the conformal dielectric layer and at least partially through the barrier layer toward the channel layer, wherein the primary gate and the secondary gate are positioned laterally between the source and drain terminals.

\* \* \* \* \*